United States Patent
Lee et al.

(10) Patent No.: US 7,545,687 B2
(45) Date of Patent: Jun. 9, 2009

(54) SEMICONDUCTOR MEMORY DEVICE

(75) Inventors: Jong-Won Lee, Kyoungki-do (KR); Sung-Kwon Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 165 days.

(21) Appl. No.: 11/824,423

(22) Filed: Jun. 29, 2007

(65) Prior Publication Data

US 2008/0056036 A1    Mar. 6, 2008

(30) Foreign Application Priority Data

Aug. 31, 2006    (KR) .................. 10-2006-0083558

(51) Int. Cl.
*G11C 7/00*    (2006.01)
(52) U.S. Cl. .................. 365/195; 365/201; 365/222; 365/194; 365/189.07
(58) Field of Classification Search .............. 365/195, 365/194, 201, 222, 189.07
See application file for complete search history.

(56) References Cited

U.S. PATENT DOCUMENTS 5,793,685 A * 8/1998 Suma .................. 365/201
5,825,705 A * 10/1998 Tsukude et al. .............. 365/222

FOREIGN PATENT DOCUMENTS

| KR | 1999-009107 | 2/1999 |
| KR | 10-0218733 | 6/1999 |
| KR | 2003-0001826 | 1/2003 |
| KR | 10-2004-0093789 | 11/2004 |

* cited by examiner

*Primary Examiner*—Son Dinh
(74) *Attorney, Agent, or Firm*—Blakely, Sokoloff, Taylor & Zafman

(57) ABSTRACT

A semiconductor memory device checks a RAS timing to recognize and set an operation timing of the semiconductor memory device. The semiconductor memory device includes an input buffer, a RAS timing controller and a bank controller. The input buffer transmits a RAS timing test signal. The RAS timing controller generates a RAS timing signal. The bank controller controls a refresh operation timing in response to an output of the input buffer in a test mode and the RAS timing signal in a normal mode.

11 Claims, 4 Drawing Sheets

SEMICONDUCTOR MEMORY DEVICE

CROSS-REFERENCE TO RELATED APPLICATIONS

The present invention claims priority of Korean patent application no. 10-2006-0083558, filed in the Korean Patent Office on Aug. 31, 2006, which is incorporated by reference in its entirety.

BACKGROUND OF THE INVENTION

The present invention relates to a semiconductor memory device; more particularly, to a semiconductor memory device performing a refresh operation.

A semiconductor memory device is an apparatus for storing a plurality of data and reading the stored data. The semiconductor memory device comprises a data storage area, a peripheral area and an I/O area. In the data storage area, there are a plurality of unit cells for storing data; and, in the peripheral area, there are circuits for inputting data into the plurality of unit cells or outputting data from the plurality of unit cells.

A dynamic random access memory (DRAM), generally used as a semiconductor memory device, includes a MOS transistor and a capacitor constituting a unit cell. In order for the DRAM to store more data within a closed size, it is required that the MOS transistor and the capacitor are fabricated smaller.

A semiconductor memory device such as a DRAM uses a capacitor as an element for storing data. Because the capacitor has characteristic of losing charges corresponding to the data as time passes away, the semiconductor memory device should regularly refresh the data stored in the capacitor. The semiconductor memory device supplies charges to the capacitor according to stored data before the charges stored in the capacitor decreases under a predetermined level, which is called a refresh operation.

The refresh operation includes an auto refresh operation and a self refresh operation. While accessing data, a semiconductor memory device receives a command relating to the auto refresh operation from an external device and performs the auto refresh operation. The self refresh operation is performed when the semiconductor memory device does not access data, for example, during a power down mode. The semiconductor memory device generates a periodic signal in response to an inputted command relating to the self refresh operation. The semiconductor memory device performs the self refresh operation according to the periodic signal.

A semiconductor memory device accesses data during an active operation and reading/writing operations. During the active operation, the semiconductor memory device receives a row address from an external device and selects a word line corresponding to the row address. Using bit line sense amplifiers, the semiconductor memory device senses and amplifies data stored in unit cells corresponding to the selected word line.

During the reading/writing operations, the semiconductor memory device outputs data corresponding to a column address among the amplified data or replaces the data with an input data from an external device. After the data are read or written, the data amplified by the bit line sense amplifiers are rewritten into the unit cells respectively. After the data are rewritten, a precharge operation is subsequently performed.

The refresh operation is processed like the active operation. However, the semiconductor memory device selects a word line coupled to cells to be refreshed not according to an external row address but to an address generated from an internal counter during the refresh operation. In addition, there is no reading/writing operation during the refresh operation. Data in unit cells corresponding to the selected word line are sensed and amplified by bit line sense amplifiers and restored into the unit cells respectively. The data are latched in the bit line sense amplifiers and restored into the corresponding unit cell after a predetermined time. The predetermined time for latching the data by the bit line sense amplifiers is determined according to a RAS timing of memory's specification.

The RAS timing means a time required when data in unit cells are sensed and amplified by bit line sense amplifiers and the amplified data are restored into the original unit cells during the refresh operation. Accordingly, it is important for the semiconductor memory device to maintain a RAS timing accurately.

A semiconductor memory device is generally manufactured with a RAS timing having a predetermined value according to an initial design requirement. However, after the semiconductor memory device is manufactured, the refresh operation of the semiconductor memory device may be not performed with the RAS timing according to the initial design requirement. That is, an actual RAS timing can be too long or short for the semiconductor memory device to perform the refresh operation. If the RAS timing is too long, a refresh operation time also increases and too much current is consumed. On the other hand, if the RAS timing is too short, the refresh operation is not performed sufficiently and, as a result, stored data can be lost.

SUMMARY OF THE INVENTION

Embodiments of the present invention are directed to provide a semiconductor memory device for checking a RAS timing to recognize and set an operation timing of the semiconductor memory device.

In accordance with an aspect of the present invention, a semiconductor memory device comprises an input buffer for transmitting a RAS timing test signal, a RAS timing controller for generating a RAS timing signal, and a bank controller for controlling a refresh operation timing in response to an output of the input buffer in a test mode and the RAS timing signal in a normal mode.

In accordance with an another aspect of the present invention, a method for driving a semiconductor memory device comprises performing a refresh operation in response to a refresh command in a test mode, stopping the refresh operation in response to a RAS timing test signal, testing data refreshed by the refresh operation, and controlling a RAS timing according to the result of testing the data.

DESCRIPTION OF SPECIFIC EMBODIMENTS

In accordance with the present invention, a RAS timing for controlling a refresh operation of a semiconductor memory device can be checked and adjusted. Accordingly the semiconductor memory device can be optimized to perform the refresh operation by selecting a proper RAS timing based on conditions such as a temperature, a system operation speed, etc. Operational reliability of the semiconductor device is also improved.

Hereinafter, a semiconductor memory device in accordance with the present invention will be described in detail referring to the accompanying drawings.

Figure 1:
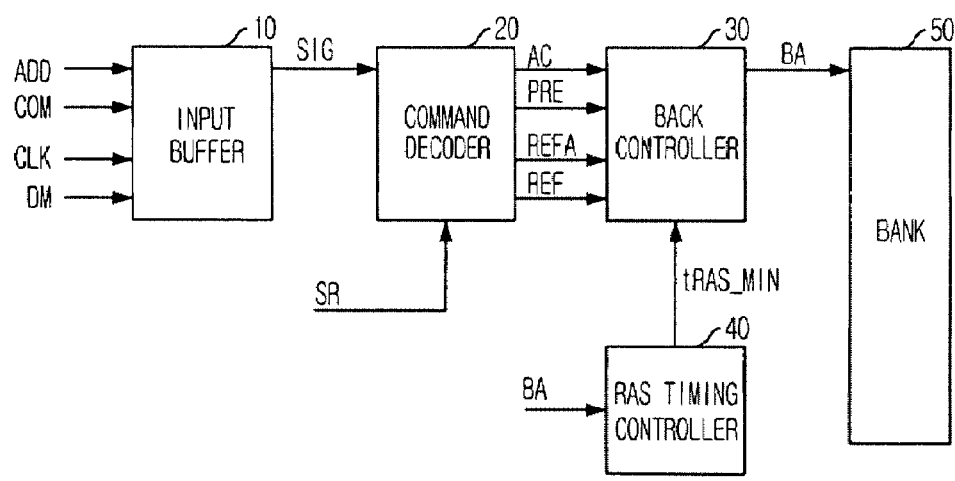
FIG. 1 is a block diagram showing a semiconductor memory device in accordance with the present invention.

FIG. 1 is a block diagram showing a semiconductor memory device in accordance with the present invention. The semiconductor memory device includes input buffer 10, a command decoder 10, a bank controller 30, a RAS timing controller 40 and a bank 50.

The input buffer 10 receives an address ADD and a command COM in response to a clock signal CLK and outputs an internal command SIG to the command decoder 20. The command decoder decodes the internal command SIG inputted from the input buffer 10 to output an active signal AC and a precharge signal PRE. In addition, the command decoder 20 outputs refresh signals REFA and REF according to a self refresh signal SR. The active signal AC is for controlling an active operation. The precharge signal PRE is for controlling a precharge operation. The self refresh signal SR is inputted from an external device for controlling a self refresh operation. The refresh signals REFA and REF are for controlling a refresh operation.

The bank controller 30 receives the active signal AC, the precharge signal PRE, and the refresh signals REFA and REF. to thereby output a control signal BA for enabling the bank 50. The RAS timing controller 40 receives the control signal BA and outputs a RAS timing signal tRAS_MIN after a predetermined time. The RAS timing signal tRAS_MIN is a signal for controlling when the bank 50 is enabled during the refresh operation. The bank controller 30 inactivates the control signal BA in response to the RAS timing signal tRAS_MIN.

Figure 2:
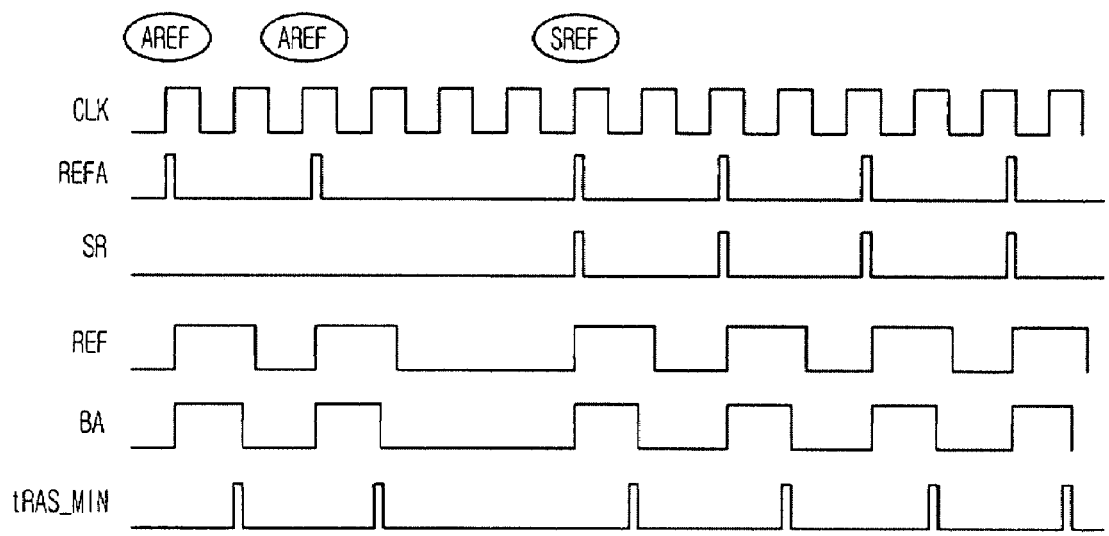
FIG. 2 is a signal timing diagram depicting an operation of the semiconductor memory device described in FIG. 1.

FIG. 2 is a signal timing diagram depicting an operation of the semiconductor memory device described in FIG. 1.

When an auto refresh command AREF or a self refresh command SREF is inputted to the semiconductor memory device, the control signal BA is enabled and maintained in a high level for a predetermined period, i.e., a RAS timing. The control signal BA is disabled in response to the RAS timing signal tRAS_MIN. The RAS timing signal tRAS_MIN is generated after a predetermined time passes from a timing of inputting the auto refresh command AREF or the self refresh command SREF. Accordingly, the semiconductor memory device should generate the RAS timing signal tRAS_MIN at a required timing to thereby perform the refresh operation without malfunctions.

Figure 3:
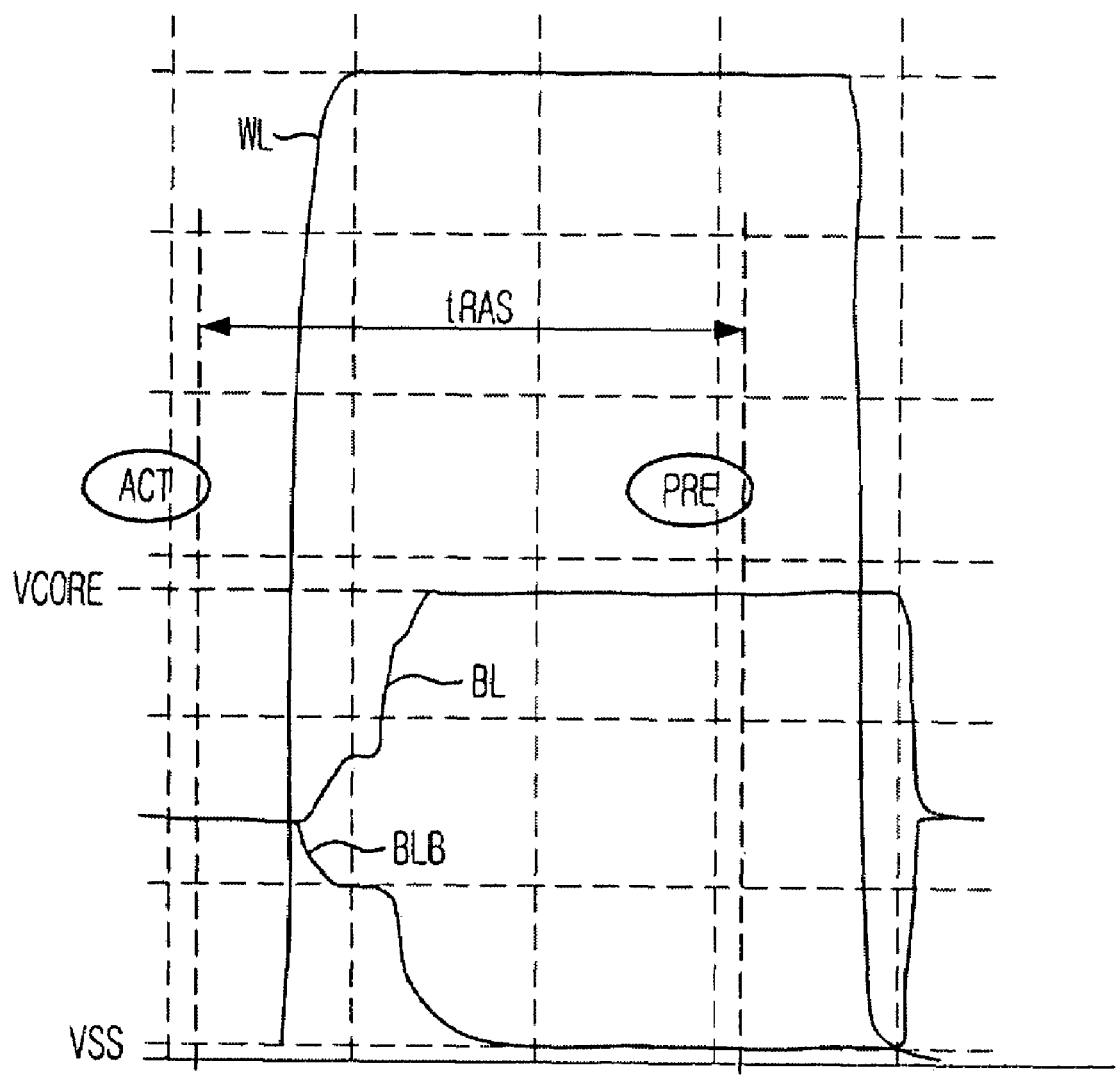
FIG. 3 is a signal timing diagram depicting a refresh operation of the semiconductor memory device described in FIG. 1.

FIG. 3 is a signal timing diagram depicting the refresh operation of the semiconductor memory device described in FIG. 1.

During the refresh operation, a corresponding word line WL is activated and data in unit cells corresponding to the activated word line WL are transmitted to a bit line pair BL and BLB. The data transmitted to the bit line pair BL and BLB are amplified by bit line sense amplifiers. The data amplified in the bit line pair BL and BLB are restored in the corresponding unit cells.

Figure 4:
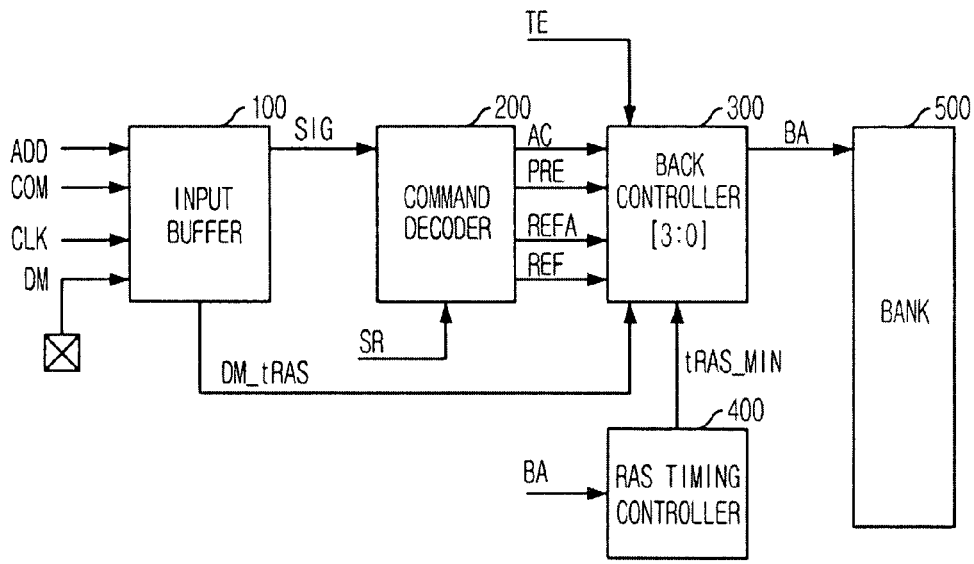
FIG. 4 is a block diagram showing a semiconductor memory device in accordance with another embodiment of the present invention.

FIG. 4 is a block diagram showing a semiconductor memory device in accordance with another embodiment of the present invention. The semiconductor memory device includes an input buffer 100, a command decoder 200, a bank controller 300, a RAS timing controller 400, and a bank 500.

The input buffer 100 receives an address ADD and a command COM in response to a clock signal CLK and outputs an internal command SIG to the command decoder 200. In addition, the input buffer 100 receives a RAS timing test signal DM_tRAS through a data mask pad DM and outputs the RAS timing test signal DM_tRAS to the bank controller 300.

The command decoder decodes the internal command SIG inputted from the input buffer 100 and outputs an active signal AC and a precharge signal PRE. In addition, the command decoder 200 outputs refresh signals REFA and REF according to a self refresh signal SR.

The data mask pad DM is for the semiconductor memory device to perform a data masking operation. Receiving an external control signal through the data mask pad in a normal operation, the semiconductor memory device stops outputting data, which is called the data masking operation. In a test mode, the semiconductor memory device of the present invention receives the RAS timing test signal DM_tRAS through the data mask pad DM.

The bank controller 300 receives the active signal AC, the precharge signal PRE, and the refresh signals REFA and REF to thereby output a control signal BA enabling the bank 500. The bank controller 300 controls a refresh operation timing of the bank 500 in response to an output of the input buffer 100 in the test mode or a RAS timing signal tRAS_MIN in the normal mode. The bank controller 300 receives the RAS timing test signal DM_tRAS in response to a test signal TE activated in the test mode to thereby control activation of the control signal BA. The bank controller 300 controls activation of the control signal BA in response to the RAS timing signal tRAS_MIN outputted from the RAS timing controller 400 in the normal signal.

The RAS timing controller 400 outputs the RAS timing signal tRAS_MIN after a predetermined RAS timing passes from the activation of the control signal BA. The bank 500 activates a corresponding word line in response to the control signal BA and refreshes data in unit cells corresponding to the activated bank.

Figure 5:
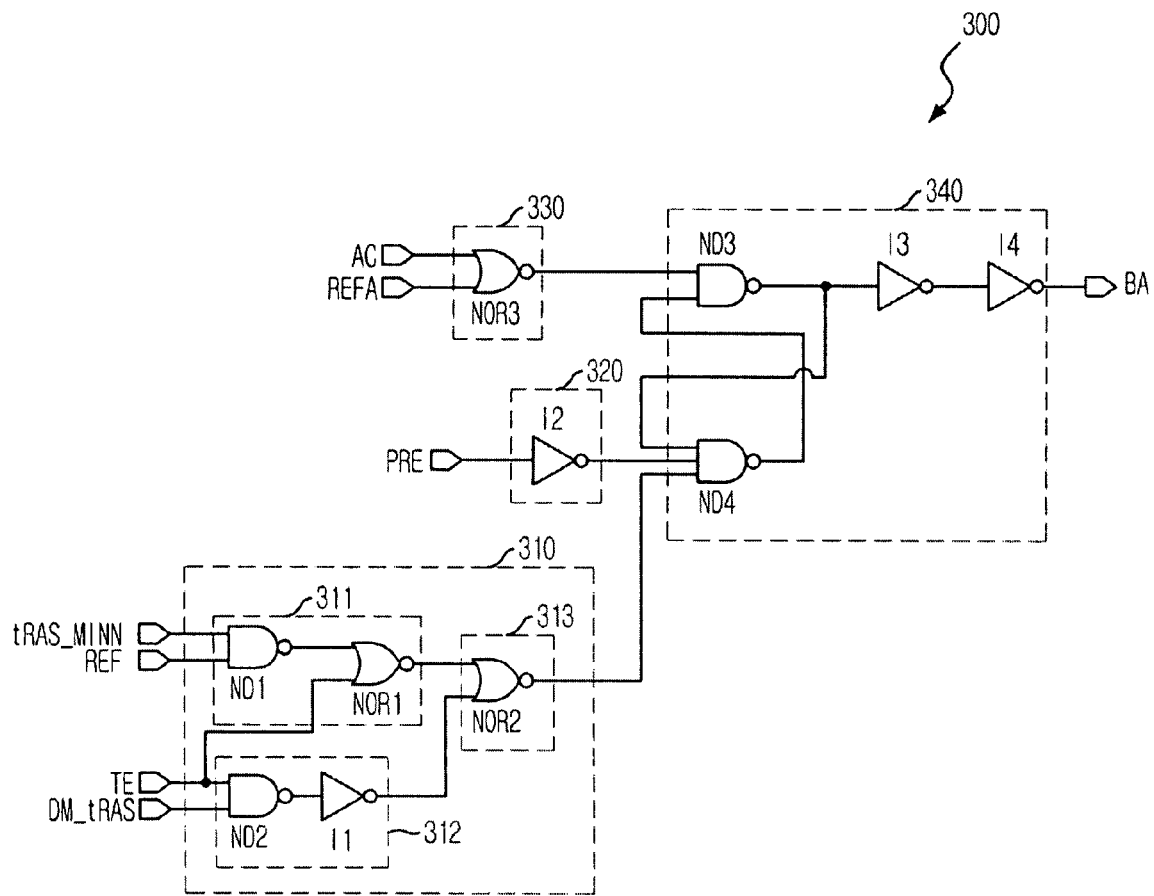
FIG. 5 is a schematic circuit diagram showing a bank controller described in FIG. 4.

FIG. 5 is a schematic circuit diagram showing the bank controller 300 described in FIG. 4. The bank controller 300 includes a RAS timing signal transmitter 310, a precharge signal transmitter 320, an operation signal transmitter 330 and a latch unit 340.

The RAS timing signal transmitter 310 transmits the RAS timing test signal DM_tRAS or the RAS timing signal tRAS_MIN and refresh signal REF to the latch unit 340 in response to the test signal TE. The precharge signal transmitter 320 transmits the precharge signal PRE to the latch unit 340. The operation signal transmitter 330 transmits the active signal AC or the refresh signal REFA to the latch unit 340. The latch unit 340 latches outputs of the RAS timing signal transmitter 310 and the operation signal transmitter 330 to output the control signal BA for enabling the bank 500.

The RAS timing signal transmitter 310 includes a first logic comparator 311, a second logic comparator 312, and a third logic comparator 313. The first logic comparator 311 performs a logic operation to the RAS timing signal tRAS_MIN outputted from the RAS timing controller 400 and the refresh signal REF outputted from the command decoder 200.

The second logic comparator 312 performs a logic operation to the test signal TE and the RAS timing test signal DM_tRAS. The third logic comparator 313 performs a logic operation to outputs of the first logic comparator 311 and the second logic comparator 312.

The operation signal transmitter 330 includes a NOR gate NOR3 for performing a logic operation to the active signal AC and refresh signal REF. The latch unit 340 includes NAND gates ND3 and ND4 and inverters I3 and I4. The NAND gates ND3 and ND4 receive outputs of the operation signal transmitter 330 and the RAS timing signal transmitter 310 through one input terminal respectively. The NAND gates ND3 and ND4 each receive the other's output through a second input terminal. The inverters I3 and I4 buffer an output of the NAND gate ND3.

Figure 6:
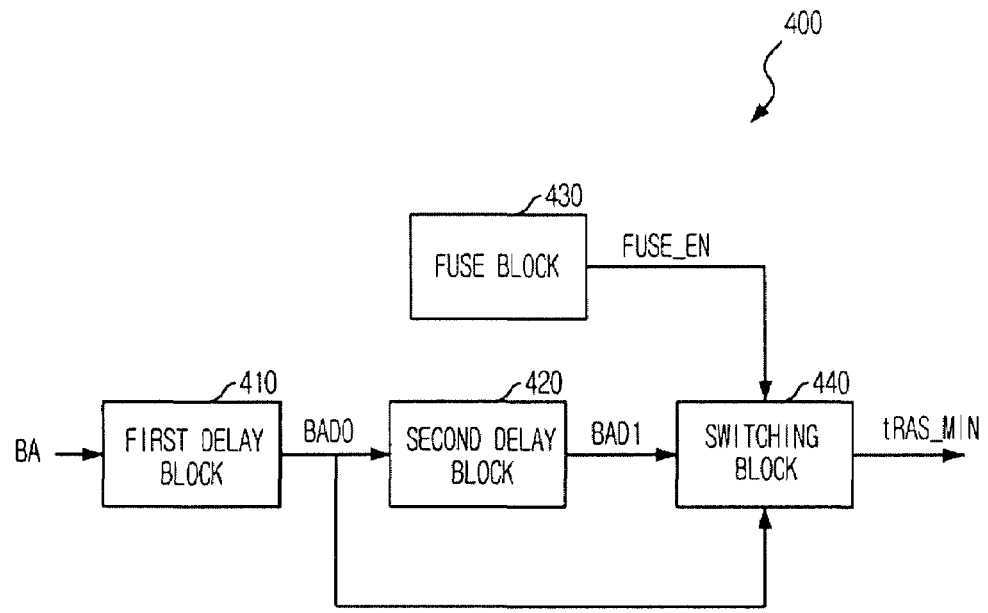
FIG. 6 is a block diagram showing a RAS timing controller described in FIG. 4.

FIG. 6 is a block diagram showing a RAS timing controller described in FIG. 4. The RAS timing controller 400 includes a first delay block 410, a second delay block 420, a fuse block 430 and switch block 440.

The first delay block 410 receives the control signal BA and delays the control signal BA for a first delay time. The second delay block 420 delays an output of the first delay block 410 for a second delay time. The fuse block 430 outputs a timing control signal according to whether a plurality of fuses blow out or not. The switch block 440 outputs the output of the first delay block 410 or an output of the second delay block 420 as the RAS timing signal tRAS_MIN according to the timing control signal. The first delay time and the second delay time may be identical or different according to embodiments of the present invention. The first and the second delay times are determined according to variations of the RAS timing of the semiconductor memory device.

Figure 7:
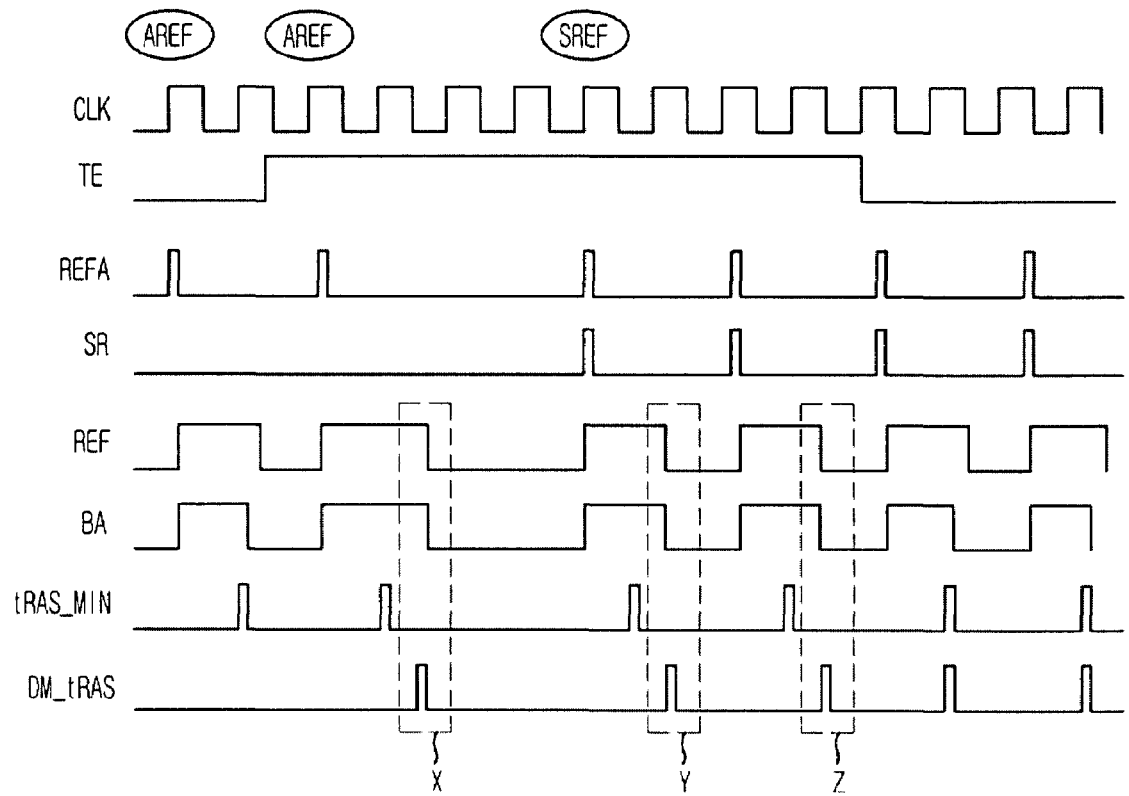
FIG. 7 is a signal timing diagram depicting an operation of the semiconductor memory devices described in FIG. 4.

FIG. 7 is a signal timing diagram depicting an operation of the semiconductor memory devices described in FIG. 4. In the semiconductor memory device of the present invention, the RAS timing for the refresh operation can be controlled. That is, the RAS timing signal can be generated at different timings according to a test result.

In the test mode, the RAS timing test signal DM_tRAS is inputted from an external device to the input buffer 100 through the data mask pad DM. The input buffer 100 outputs the RAS timing test signal DM_tRAS to the bank controller 300. The bank controller 300 outputs the control signal BA in a high level in the test mode, in order for the bank 500 to perform the refresh operation. In response to the RAS timing test signal DM_tRAS, the bank controller 300 disables the control signal BA. After the control signal BA is disabled, stored data are checked to confirm whether the refresh operation is completed or not. Because the RAS timing is controlled by an external signal during the test mode, an optimum RAS timing for the semiconductor memory device can be found. Referring to X, Y and Z shown in FIG. 7, when a test signal TE is activated in a high level, the control signal BA is disabled in response to the RAS timing test signal DM_tRAS, without regard to the RAS timing signal tRAS_MIN.

The RAS timing controller 400 generates the RAS timing signal tRAS_MIN according to the optimum RAS timing. By a plurality of fuses in the RAS timing controller 400, the RAS timing signal tRAS_MIN is controlled.

In the normal mode, the RAS timing signal tRAS_MIN is activated after a corrected RAS timing passes from an activation of the control signal BA and inputted to the bank controller 300.

A semiconductor memory device does not perform an over driving operation during the refresh operation, in order to decrease a power consumption. The over driving operation means that an initial driving voltage for sensing and amplifying data is temporally increased and supplied. It results in increasing an operation speed of the semiconductor memory device. Because there is no actual operation for accessing data during the refresh operation, the over driving operation is not performed. Accordingly, as compared against the normal operation, bit line sense amplifiers for sensing and amplifying data may not operate efficiently during the refresh operation. It is more important to find an optimum RAS timing which is taken for the bit line sense amplifiers to sense and amplify data from unit cells and restore the data to the unit cells.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   an input buffer for transmitting a RAS timing test signal;
   a RAS timing controller for generating a RAS timing signal; and
   a bank controller for controlling a refresh operation timing in response to the RAS timing test signal in a test mode and the RAS timing signal in a normal mode.

2. The semiconductor memory device of claim 1, further comprising a command decoder for decoding an output of the input buffer and outputting an active signal and a refresh signal to the bank controller.

3. The semiconductor memory device of claim 2, wherein the input buffer further buffers external address and command signals to output the buffered signals to the command decoder.

4. The semiconductor memory device of claim 3, wherein the bank controller includes:
   a RAS timing signal transmitter for transmitting one of the RAS timing test signal and the RAS timing signal in response to the test signal;
   an operation signal transmitter for transmitting one of the active signal and the refresh signal; and
   a latch unit for latching outputs of the RAS timing signal transmitter and the operation signal transmitter to output a control signal.

5. The semiconductor memory device of claim 4, wherein the RAS timing signal transmitter includes:
   a first logic comparator for performing a logic operation on the RAS timing signal outputted from the RAS timing controller and the refresh signal outputted from the command decoder;
   a second logic comparator for performing a logic operation on the test signal and the RAS timing test signal; and
   a third logic comparator for performing a logic operation on outputs of the first logic comparator and the second logic comparator.

6. The semiconductor memory device of claim 5, wherein the operation signal transmitter includes a fourth logic comparator for performing a logic operation on the active signal and the refresh signal.

7. The semiconductor memory device of claim 6, wherein the latch unit includes:
   a first and a second NAND gates for receiving outputs of the operation signal transmitter and the RAS timing signal transmitter through one input terminal respectively and each receiving the other's output through a second input terminal; and
   a buffer for buffering an output of the first NAND gate.

8. The semiconductor memory device of claim 1, wherein the RAS timing controller outputs the RAS timing signal after a predetermined RAS timing passes from an activation of a control signal outputted from the bank controller for controlling the refresh operation timing.

9. The semiconductor memory device of claim 8, wherein the RAS timing controller includes:
- a first delay block for receiving the control signal and delaying the control signal for a first delay time;
- a second delay block for delaying an output of the first delay block for a second delay time;
- a fuse block for outputting a timing control signal according to whether a plurality of fuses blow or not; and
- a switch block for outputting the output of the first delay block or an output of the second delay block as the RAS timing signal according to the timing control signal.

10. The semiconductor memory device of claim 1, wherein the input buffer receives the RAS timing test signal through a data mask pad.

11. A method for driving a semiconductor memory device, comprising:
- performing a refresh operation in response to a refresh command in a test mode;
- stopping the refresh operation in response to a RAS timing test signal;
- testing data refreshed by the refresh operation; and
- controlling a RAS timing according to a result of the testing of the data.

* * * * *